United States Patent
Takeuchi et al.

[11] Patent Number: 5,889,352
[45] Date of Patent: Mar. 30, 1999

[54] PIEZO-ELECTRIC/ELECTROSTRICTIVE FILM TYPE ELEMENT

[75] Inventors: Yukihisa Takeuchi, Nishikamo-gun; Koji Kimura, Nagoya; Tsutomu Nanataki, Toyoake, all of Japan

[73] Assignee: NGK Insulators, Ltd., Japan

[21] Appl. No.: 727,083

[22] Filed: Oct. 8, 1996

[30] Foreign Application Priority Data

Oct. 13, 1995 [JP] Japan ................................. 7-265160

[51] Int. Cl.$^6$ ................................................. H01L 41/08
[52] U.S. Cl. ................................................ 310/330; 310/324
[58] Field of Search ........................... 310/328, 324, 310/330–332; 347/68–72

[56] References Cited

U.S. PATENT DOCUMENTS

| | | | |
|---|---|---|---|
| 2,540,194 | 2/1951 | Ellett | 171/327 |
| 3,509,387 | 4/1970 | Thorn et al. | 310/321 X |
| 4,383,763 | 5/1983 | Hutchings et al. | 356/350 |
| 4,456,850 | 6/1984 | Inoue et al. | 310/324 |
| 4,491,761 | 1/1985 | Grudkowski et al. | 310/359 |
| 4,564,851 | 1/1986 | Nilsson et al. | 346/140 |
| 4,633,120 | 12/1986 | Sato et al. | 310/328 |
| 4,638,206 | 1/1987 | Tsunooka et al. | 310/313 |
| 4,649,313 | 3/1987 | Ogawa et al. | 310/358 |
| 4,680,595 | 7/1987 | Gruz-Uribe et al. | 346/140 |
| 4,697,118 | 9/1987 | Harnden, Jr. et al. | 310/331 |
| 4,742,260 | 5/1988 | Shimizu et al. | 310/323 |
| 4,742,264 | 5/1988 | Ogawa | 310/332 |
| 4,766,671 | 8/1988 | Utsumi et al. | 29/848 |
| 4,769,570 | 9/1988 | Yokoyama et al. | 310/332 |
| 4,780,639 | 10/1988 | Shirasu | 310/328 |
| 4,783,821 | 11/1988 | Muller et al. | 381/173 |
| 4,825,227 | 4/1989 | Fischbeck et al. | 346/1.1 |
| 4,906,840 | 3/1990 | Zdeblick et al. | 250/306 |
| 5,059,566 | 10/1991 | Kanai et al. | 501/138 |
| 5,126,615 | 6/1992 | Takeuchi et al. | 310/330 |
| 5,210,455 | 5/1993 | Takeuchi et al. | 310/328 |
| 5,376,856 | 12/1994 | Takeuchi et al. | 310/328 |

FOREIGN PATENT DOCUMENTS

| | | | |
|---|---|---|---|
| 0 262 637 | 4/1988 | European Pat. Off. | |
| 0629007 | 12/1994 | European Pat. Off. | 310/330 |
| 0667647 | 8/1995 | European Pat. Off. | 310/330 |
| 0671772 | 9/1995 | European Pat. Off. | 310/330 |
| 2 570 223 | 9/1974 | France . | |
| 45-6103 | 3/1970 | Japan . | |
| 46-26140 | 9/1971 | Japan . | |
| 58-196069 | 11/1983 | Japan . | |
| 61-253873 | 11/1986 | Japan . | |
| 62-213399 | 9/1987 | Japan . | |
| 2 161 647 A | 1/1986 | United Kingdom . | |
| 89/07259 | 8/1989 | WIPO . | |

*Primary Examiner*—Mark O. Budd
*Attorney, Agent, or Firm*—Parkhurst & Wendel

[57] ABSTRACT

A piezo-electric/electrostrictive film type element is constituted of a ceramic substrate including a spacer plate having at least one window, and a thin closure plate for closing the window, integrally joined to the spacer plate, and a piezo-electric/electrostrictive working portion having a lower electrode, a piezo-electric/electrostrictive layer and an upper electrode disposed in turn in the form of a layer at a closure position of the window on the outer surface of the closure plate by a film formation method. The piezo-electric/electrostrictive layer is arranged so as to cover a part only of the area of the window in a plan view. Since at the end portions of the void, the piezo-electric/electrostrictive working portion does not pick up fluctuation and vibration which would contain noise at the end portions of the void, the noise at the time of sensing, filtering or acoustic oscillation can be remarkably minimized, and a gap between the characteristics of a simulation at the time of design and those of the actual product can be remarkably reduced.

3 Claims, 3 Drawing Sheets

PIEZO-ELECTRIC/ELECTROSTRICTIVE FILM TYPE ELEMENT

BACKGROUND OF THE INVENTION AND RELATED ART

The present invention relates to a piezo-electric/electrostrictive film type element, and more specifically, it relates to a piezo-electric/electrostrictive film type element which can be suitably used as a sensor, a filter or the like.

In recent years, as one of mechanisms for detecting a pressure change or the like of a void formed in a substrate, a piezo-electric/electrostrictive film type element is known in which a piezo-electric/electrostrictive working portion is formed on the outer surface of the void, and the piezo-electric/electrostrictive working portion functions as a mechanical/electrical converter to detect the volume change of the void by the pressure change in the void. Such a piezo-electric/electrostrictive film type element has been utilized as, for example, a sensor or a filter. The pressure change of an atmosphere to be detected which has been introduced through an opening expands or contracts the volume of the void, and at this time, the strain of the wall of the void gives a mechanical change to the piezo-electric/electrostrictive working portion and this mechanical change is then converted into an electrical signal by the piezo-electric/electrostrictive working portion.

FIG. 5 shows one embodiment of the conventional and known piezo-electric/electrostrictive film type element used as the sensor. In this drawing, the pressure change of an atmosphere to be detected which has been introduced through an opening 26 expands or contracts the volume of a void 30, and at this time, the strain of the wall of the void gives a mechanical change to a piezo-electric/electrostrictive working portion 22 and this mechanical change is then converted into an electrical signal by the piezo-electric/electrostrictive working portion 22.

A piezo-electric/electrostrictive film type element 20 is constituted of a ceramic substrate 21 and the piezo-electric/electrostrictive working portion 22 integrally attached to ceramic substrate 21. Furthermore, this ceramic substrate 21 is integrally constituted of a thin and planar closure plate 23, a base plate 24, and a spacer plate 25 sandwiched between these members 23, 24.

The spacer plate 25 is provided with a window 28, and the spacer plate 25 and the base plate 24 are superposed on each other so that this window 28 may be communicated with the opening 26 formed through the base plate 24. Moreover, on the side of the spacer plate 25 opposite to the side thereof superposed on the base plate 24, the closure plate 23 is superposed, and the opening of the window 28 is closed by the closure plate 23.

Thus, a void 30 is formed in the ceramic substrate 21.

On the outer surface of the closure plate 23 of the ceramic substrate 21, the piezo-electric/electrostrictive working portion 22 is arranged on a position corresponding to the void 30. Here, the piezo-electric/electrostrictive working portion 22 is constituted of a lower electrode 31, a piezo-electric/electrostrictive layer 32 and an upper electrode 33.

The conventional and known piezo-electric/electrostrictive film type element is constituted as described above, and a plan view of the piezo-electric/electrostrictive layer 32 and the void 30 is shown in FIG. 6. For the enhancement of a mechanical/electrical conversion efficiency, the piezo-electric/electrostrictive layer 32 is formed somewhat larger than the void 30 so that the piezo-electric/electrostrictive layer 32 may cover the whole surface of the void 30, a manufacturing precision being taken into consideration.

However, if the piezo-electric/electrostrictive working portion 22 is formed so as to cover the whole plate area of the void 30, it has been considered that a vibration mode based on the fluctuation of the piezo-electric/electrostrictive working portion 22 is not uniform in the central portion and the end portions of the void 30 owing to the restriction of these corner portions. In consequence, a certain gap has occurred between the characteristics of a simulation at the design of a sensor, a filter, an acoustic oscillator or the like and those of the actual product.

Furthermore, in the case that the piezo-electric/electrostrictive working portion 22 is arranged so as to cover the whole planar area of the void 30, the electrode films (the upper and lower electrodes) 31, 33 and the piezo-electric/electrostrictive layer 32 can be formed on the outer surface of the closure plate 23 by a known film formation method, for example, a means such as a screen printing method or a spray method, followed by a heat treatment. At this time of the heat treatment, the respective films contract due to the firing, but both the end portions of the void 30 contract much less (i.e., they are not densified) as compared with the central portion thereof owing to the restriction at both the ends portions of the void 30. As a result, some problems are present. For example, a firing degree is not uniform on the whole, and a large stress remains in both the end portions. Such an ununiformed firing degree of the void 30 has a bad influence on the vibration mode of the piezo-electric/electrostrictive working portion 22.

SUMMARY OF THE INVENTION

Therefore, an object of the present invention is to provide a piezo-electric/electrostrictive film type element by which the vibration mode of a piezo-electric/electrostrictive working portion can be achieved as designed and which can minimize noise at the time of sensing, filtering or acoustic oscillation.

That is to say, according to the present invention, there can be provided a piezo-electric/electrostrictive film type element which comprises a ceramic substrate comprising a spacer plate having at least one window, and a thin closure plate for closing the window, integrally joined to the spacer plate, and a piezo-electric/electrostrictive working portion comprising a lower electrode, a piezo-electric/electrostrictive layer and an upper electrode disposed in turn in the form of a layer at a closure position of the window on the outer surface of the closure plate by a film formation method, the piezo-electric/electrostrictive layer being arranged so as to cover a part only of the area of the window in a plan view.

According to the present invention, there can be further provided a piezo-electric/electrostrictive film type element which comprises a ceramic substrate comprising a spacer plate having at least one window, and a thin closure plate for closing the window, integrally joined to the spacer plate, and a piezo-electric/electrostrictive working portion comprising a lower electrode, a piezo-electric/electrostrictive layer, which is substantially rectangular in a plan view, and an upper electrode disposed in turn in the form of a layer at a closure position of the window on the outer surface of the closure plate by a film formation method, the window of the spacer plate and the piezo-electric/electrostrictive layer each having two symmetrical axes extending in a common direction in the plan view, a side of the substantially rectangular piezo-electric/electrostrictive layer which intersects with either of the symmetrical axes being retracted from an intersection in the plan view between the symmetrical axis and the window in the direction of an intersection between the two symmetrical axes by a distance 5 times or more as much as the thickness of the closure plate.

In the present invention, the piezo-electric/electrostrictive layer may cover the central portion only of the window (the void), or the piezo-electric/electrostrictive layer may cover the window except both the end portions of either side of the window (the void).

Furthermore, in the present invention, the piezo-electric/electrostrictive film type element means any of an element equipped with the piezo-electric film alone, an element equipped with the electrostrictive film alone, and an element equipped with both of the piezo-electric film and the electrostrictive film.

BRIEF DESCRIPTION OF THE DRAWINGS

FIG. 5 is a sectional view showing one embodiment in which a conventional known piezo-electric/electrostrictive film type element is used as a sensor.

FIG. 6 is an illustrative view showing a plan state of the piezo-electric/electrostrictive layer and the void in the piezo-electric/electrostrictive film type element shown in FIG. 5.

DESCRIPTION OF THE PREFERRED EMBODIMENT

Next, the piezo-electric/electrostrictive film type element regarding the present invention will be described, referring to attached drawings.

Figure 1:
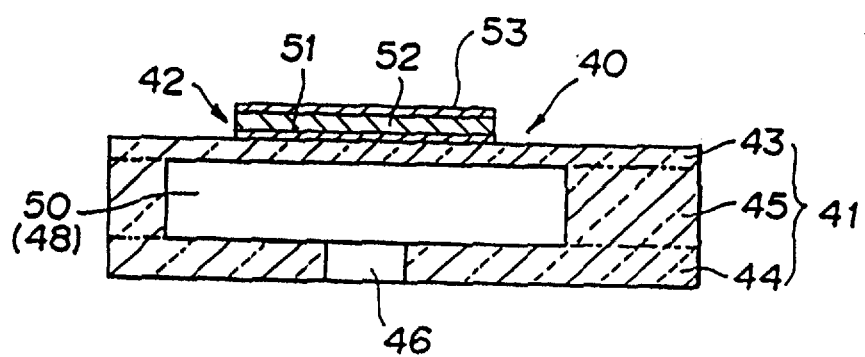
FIG. 1 is a sectional view illustrating one embodiment of a piezo-electric/electrostrictive film type element regarding the present invention.
Figure 2:
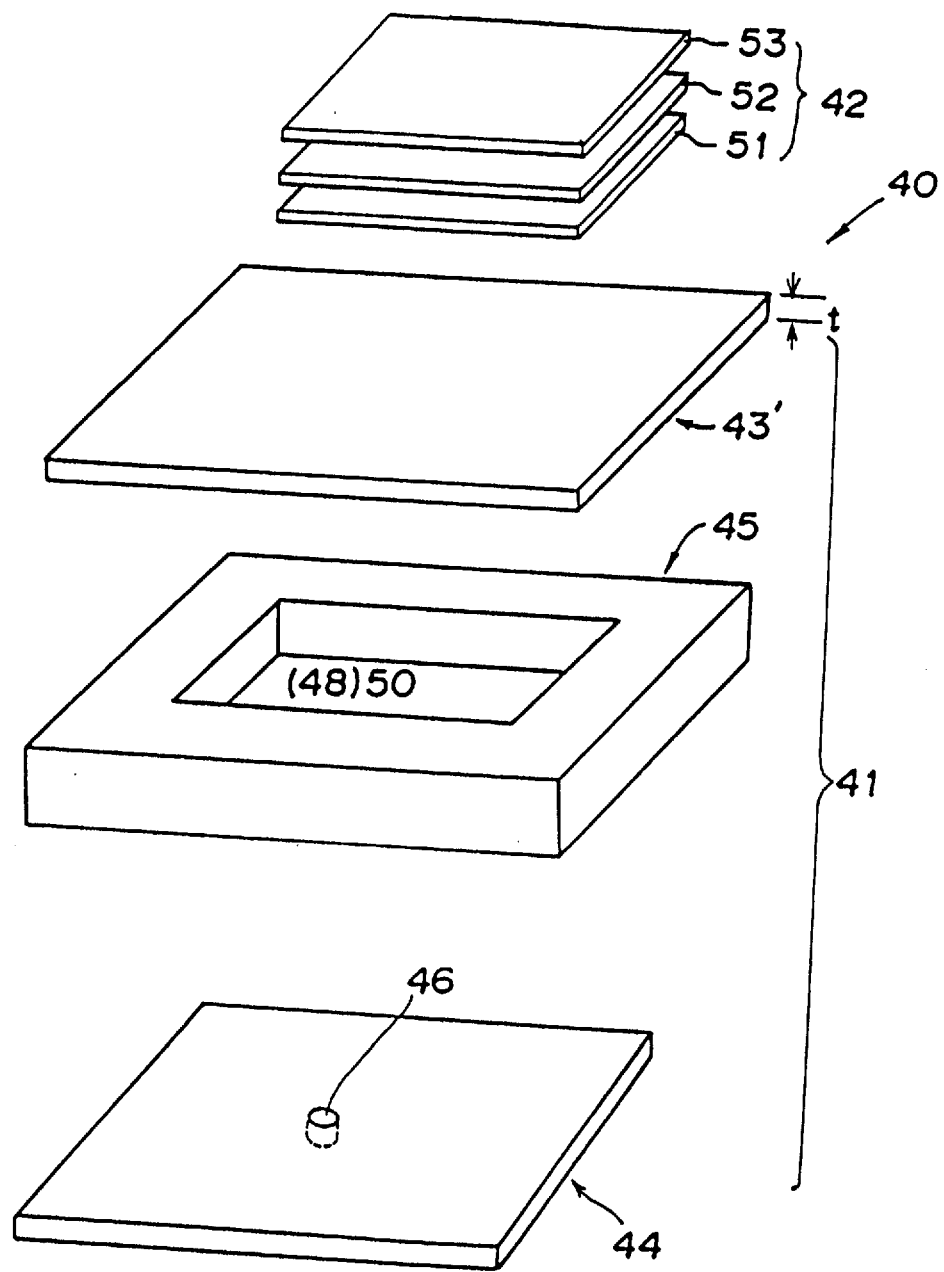
FIG. 2 is an exploded perspective view of the piezo-electric/electrostrictive film type element shown in FIG. 1.

FIG. 1 is a sectional view illustrating one embodiment of a piezo-electric/electrostrictive film type element regarding the present invention, and FIG. 2 is an exploded perspective view of the piezo-electric/electrostrictive film type element shown in FIG. 1 and it shows a case where the element is applied to a pressure sensor. A piezo-electric/electrostrictive film type element 40 is constituted of a ceramic substrate 41 and a piezo-electric/electrostrictive working portion 42 integrally formed on the ceramic substrate 41. In this ceramic substrate 41, a thin plate-like closure plate 43 is superposed on a base plate 44 with the interposition of a spacer plate 45 so that they may be integrally constituted. Here, the base plate 44 is provided with an opening 46, as shown in FIG. 5.

The spacer plate 45 is provided with at least one window 48, and the spacer plate 45 is superposed on the base plate 44 so that the window 48 may be communicated with an opening 46 formed through the base plate 44. Moreover, on the side of the spacer plate 45 opposite to the side thereof superposed on the base plate 44, the closure plate 43 is superposed, and the opening of the window 48 is closed by the closure plate 43, whereby a void 50 is formed in the ceramic substrate 41.

Furthermore, on the outer surface of the closure plate 43 of the ceramic substrate 41, the piezo-electric/electrostrictive working portion 42 is arranged so as to cover a part only of the area of the void 50 in a plan view. Here, the piezo-electric/electrostrictive working portion 42 is constituted of a lower electrode 51, a piezoelectric/electrostrictive layer 52 and an upper electrode 53.

Figure 3:
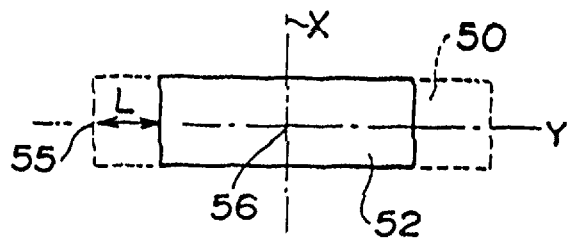
FIG. 3 is an illustrative plan view showing a state in which a piezo-electric/electrostrictive layer covers a void except both the end portions in a lengthwise direction of the void.
Figure 4:
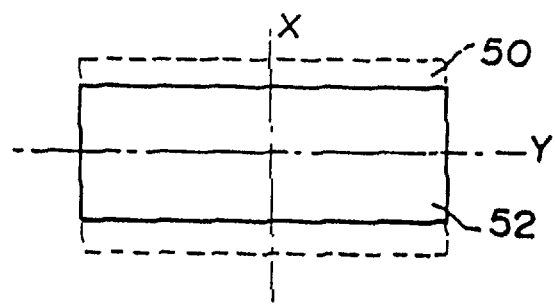
FIG. 4 is an illustrative plan view showing a state in which a piezo-electric/electrostrictive layer covers a void except both the end portions in a short direction of the void.
Figure 4:
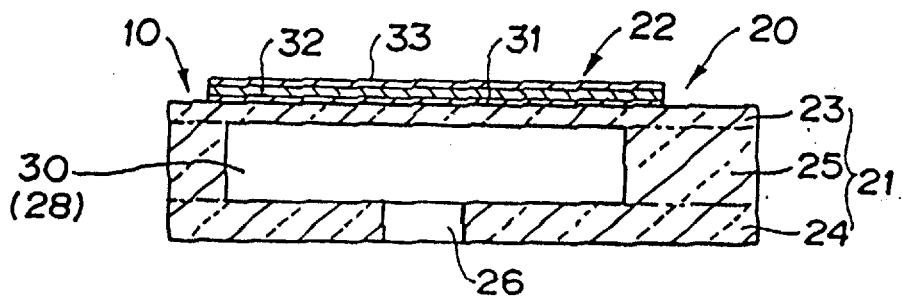
Figure 4:
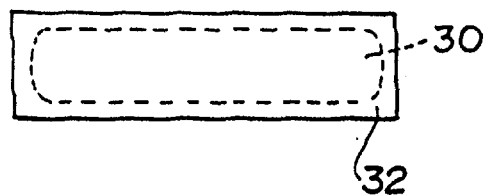

Each of FIGS. 3 and 4 is an illustrative plane view showing a state in which the piezo-electric/electrostrictive layer covers the plane area of the void (the window), and the piezo-electric/electrostrictive layer 52 is arranged on the outer surface of the closure plate 43 so that the piezo-electric/electrostrictive layer 52 may cover a part only of the plane area of the void 50, instead of covering the whole of the plane area of the void 50.

When the piezo-electric/electrostrictive layer 52 is arranged so as to cover a part of the plane area of the void 50 as described above, the piezo-electric/electrostrictive layer 52 is arranged on neither of the end portions in a lengthwise direction of the void 50, so that fluctuation and vibration occur at neither of the end portions of the void 50. In consequence, a vibration mode is uniform at the central portion and the end portions of the void 50, so that noise at the time of sensing, filtering or acoustic oscillation can be minimized.

Here, no particular restriction is put on the plane shape of the void 50, and it can take any shape of such rectangle as shown in FIGS. 3 and 4, square, ellipse, oval or a shape having polygonal portions at both the end portions.

No particular restriction is put on an embodiment in which the piezo-electric/electrostrictive layer 52 covers a part of the area of the void 50 in a plan view, and for example, there are a case where the piezo-electric/electrostrictive layer 52 covers the central portion only of the void 50, a case where it covers the void except both the end portions in a lengthwise direction of the void 50 (refer to FIG. 3), and a case where it covers the void except both the end portions in a short direction of the void 50 (refer to FIG. 4).

In the present invention, as shown in FIG. 3, in the case that the piezo-electric/electrostrictive layer 52 is rectangular and covers the void 50 except both the end portions in a lengthwise direction thereof, $L \geq 5t$ is preferable in order to avoid restriction at both the ends portions of the void 50 wherein L is a length of the portion of the void 50 which is not covered with the piezo-electric/electrostrictive layer 52, and t is the thickness of the closure plate 43.

That is to say, in the present invention, it is preferable that each of the window 48 (the void 50) of the spacer plate 45 and the piezo-electric/electrostrictive layer 52 has two symmetrical axes X, Y extending in a common direction, and a side of the substantially rectangular piezo-electric/electrostrictive layer 52 which intersects with either (Y in the case of FIG. 3) of the symmetrical axes is retracted from an intersection (55 in FIG. 3) in the plan view between the symmetrical axis and the window 48 (the void 50) in the direction of an intersection (56 in FIG. 3) between the two symmetrical axes by a distance 5 times or more as much as the thickness of the closure plate 43.

In the present invention, the ceramic substrate 41 can be formed as an integrally calcined ceramic article. Concretely, in the first place, green sheets are molded from a ceramic slurry obtained from a ceramic material, a binder, a solvent and the like by the use of a usual device such as a doctor blade. Next, if necessary, the green sheets are subjected to processings such as cutting-off, cutting and punching to form the window 48 and at least one opening 46, whereby precursors of the plates 43, 44, 45 are formed. Afterward, the respective precursors are laminated and then fired, thereby the integral ceramic substrate 41.

No particular restriction is put on the material constituting the ceramic substrate 41, but from the viewpoint of moldability and the like, alumina and zirconia can be suitably used. Furthermore, the thickness of the closure plate 43 is preferably 50 μm or less, and the thickness of the base plate 44 is preferably 10 μm or more, and the thickness of the spacer plate 45 is preferably 50 μm or more.

Moreover, the piezo-electric/electrostrictive working portion 42 is constituted of the lower electrode 51, the piezo-electric/electrostrictive layer 52 and the upper electrode 53 on the closure plate 43, and the piezo-electric/electrostrictive working portion 42 is usually formed by a film formation method.

That is to say, the lower electrode 51, the piezo-electric/electrostrictive layer 52 and the upper electrode 53 are formed on the outer surface of the closure plate 43 by a known film formation method, for example, a thick film formation method such as screen printing or spray, or a thin film formation method such as ion beam, sputtering or CVD.

The thus formed respective films (the lower electrode 51, the piezo-electric/electrostrictive layer 52 and the upper electrode 53) are next subjected to a heat treatment (firing), but this heat treatment may be carried out every the formation of each film, or it may be done simultaneously for these films after the formation of all the films.

No particular restriction is put on the material of the lower electrode 51 and the upper electrode 53 which constitute the piezo-electric/electrostrictive working portion 42, and any material can be used, so long as it is a conductive material which can withstand a high-temperature oxidizing atmosphere in the vicinity of a heat treatment (firing) temperature, and for example, single metals and alloys are usable. Additionally, conductive ceramics are also usable. Typical and suitable examples of the conductive material include high-melting noble metals such as platinum or palladium.

Furthermore, no particular restriction is put on the material of the piezo-electric/electrostrictive layer 52 which constitutes the piezo-electric/electrostrictive working portion 42, and any material can be used, so long as it is a material which can exert an electrical field inducing strain such as a piezo-electric effect or an electrostrictive effect. Typical and preferably usable examples of this material include a material mainly comprising lead titanate zirconate (PZT system), a material mainly comprising magnesium-lead niobate (PMN system) and nickel-lead niobate (PNN system).

The thickness of the piezo-electric/electrostrictive working portion 42 is usually 100 μm or less, and the thickness of the lower electrode 51 and the upper electrode 53 is usually 20 μm or less, preferably 5 μm or less. Furthermore, the thickness of the piezo-electric/electrostrictive layer 52 is preferably 50 μm or less, more preferably in the range of 3 μm to 40 μm in order to obtain a large displacement at a low operation voltage.

The embodiments of the present invention has been described above in detail, but needless to say, the scope of the present invention should not be limited by these embodiments at all. For the convenience of the description, the work of the piezo-electric/electrostrictive working portion has been explained in the order of from the mechanical displacement to the electrical signal, but needless to say, also in the case that the order of from the electrical signal to the mechanical displacement is used, the effect of the present invention can be exerted. In addition, it should be understood that, besides the above-mentioned embodiments, various changes, modifications and improvements can be given to the present invention, so long as they do not deviate from the gist of the present invention.

As described above, according to the piezo-electric/electrostrictive film type element of the present invention, the piezo-electric/electrostrictive layer is formed so as to cover a part only of the planar area of the void, and therefore, at the end portions of the void, the piezo-electric/electrostrictive working portion does not pick up fluctuation and vibration which would contain noise at the end portions of the void, and as a result, the noise at the time of sensing, filtering or acoustic oscillation can be remarkably minimized, or a gap between the characteristics of a simulation at the time of design and those of the actual product can be remarkably reduced.

The piezo-electric/electrostrictive film type element of the present invention can be suitably used as a speaker, an actuator, a filter, a sensor, a condenser array, a display, a transformer, a microphone, various vibrators, a resonator, a radiator, a gyroscope or a discriminator.

What is claimed is:

1. A piezo-electric/electrostrictive film type element which comprises:

a ceramic substrate comprising a spacer plate having at least one window, and a thin closure plate for closing the window, integrally joined to the spacer plate, and a piezo-electric/electrostrictive working portion comprising a lower electrode, a piezo-electric/electrostrictive layer, and an upper electrode disposed in turn in the form of a layer at a closure position of the window on the outer surface of the closure plate by a film formation method, the piezo-electric/electrostrictive layer being substantially rectangular and having a longer axis that is perpendicular to a shorter axis in a plan view, the window of the spacer plate having a longer axis that is perpendicular to a shorter axis so that the window and the piezo-electric/electrostrictive layer each have two symmetrical axes extending in a common direction in the plan view, the piezo-electric/electrostrictive layer being arranged so as to cover only a part of the window in both directions of the longer and shorter axes, and a side of the substantially rectangular piezo-electric/electrostrictive layer that intersects with either of the symmetrical axes being retracted from an intersection in the plan view between the symmetrical axis and the window in the direction of an intersection between the two symmetrical axes by a distance at least 5 times greater than much as the thickness of the closure plate.

2. A piezo-electric/electrostrictive film type element according to claim 1, wherein the ceramic substrate is integrally constituted of the closure plate, a base plate, and the spacer plate sandwiched between the closure plate and the base plate.

3. A piezo-electric/electrostrictive film type element according to claim 1, wherein the ceramic substrate is formed by alumina or zirconia.

* * * * *